(12) United States Patent
Oh et al.

(10) Patent No.: US 9,443,886 B2
(45) Date of Patent: Sep. 13, 2016

(54) THIN FILM TRANSISTOR SUBSTRATE AND METHOD OF FABRICATING THE SAME

(71) Applicant: LG Display Co., Ltd., Seoul (KR)

(72) Inventors: Kum-Mi Oh, Seoul (KR); Jung-Il Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/846,314

(22) Filed: Sep. 4, 2015

(65) Prior Publication Data

US 2016/0071891 A1 Mar. 10, 2016

(30) Foreign Application Priority Data

Sep. 5, 2014 (KR) .................. 10-2014-0119098

(51) Int. Cl.
*H01L 27/14* (2006.01)
*H01L 27/12* (2006.01)

(52) U.S. Cl.
CPC ......... *H01L 27/1248* (2013.01); *H01L 27/124* (2013.01); *H01L 27/1222* (2013.01); *H01L 27/1262* (2013.01)

(58) Field of Classification Search
CPC .................................... H01L 27/1248
USPC ........................................... 257/72
See application file for complete search history.

(56) References Cited

U.S. PATENT DOCUMENTS

2006/0046361 A1* 3/2006 Song ............... C11D 7/265
435/151

* cited by examiner

*Primary Examiner* — Anthony Ho
(74) *Attorney, Agent, or Firm* — Birch, Stewart, Kolasch & Birch, LLP

(57) ABSTRACT

A thin film transistor substrate according to an embodiment includes a data line and a light barrier film to overlap an active layer of a thin film transistor, wherein the data line and the light barrier film are formed simultaneously, thereby reducing the cost of fabricating the thin film transistor substrate.

13 Claims, 17 Drawing Sheets

THIN FILM TRANSISTOR SUBSTRATE AND METHOD OF FABRICATING THE SAME

This application claims the priority benefit of Korean Patent Application No. 10-2014-0119098, filed on Sep. 5, 2014, which is hereby incorporated by reference as if fully set forth herein.

BACKGROUND OF THE INVENTION

1. Field of the Invention

The present invention relates to a thin film transistor substrate and a method of fabricating the same, and more particularly to a thin film transistor substrate that can be fabricated at reduced cost and a method of fabricating the same.

2. Discussion of the Related Art

Image display devices, which are a core technology in the information communication age, for displaying various kinds of information on a screen, have been developed such that the image display devices are thinner, lighter, and portable, and exhibit high performance. In addition, flat panel display devices, which have lower weight and volume than cathode ray tubes (CRT), have been highlighted.

A liquid crystal display device, which is one such flat panel display device, adjusts a light transmission rate of liquid crystals using an electric field generated between a pixel electrode and a common electrode connected to a thin film transistor to display images.

The liquid crystal display device includes a plurality of passivation films for isolating the electrodes from each other. In particular, an organic passivation film having a low dielectric constant is formed to isolate the common electrode and a data line for supplying a data signal to the thin film transistor, from each other. The organic passivation film is relatively thick so as to reduce parasitic capacitance occurring between the common electrode and the data line. However, the cost of fabricating the liquid crystal display device increases, and it is difficult to fabricate the liquid crystal display device in a slim fashion, with the increase in thickness of the organic passivation film.

In addition, the number of masking processes for patterning increases with the increase in the number of the passivation films. As a result, the masking processes become complicated, whereby the cost of fabricating the liquid crystal display device increases.

SUMMARY OF THE INVENTION

Accordingly, the present invention is directed to a thin film transistor substrate and a method of fabricating the same that substantially obviate one or more problems due to limitations and disadvantages of the related art.

An object of the present invention is to provide a thin film transistor substrate that can be fabricated at reduced cost and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a thin film transistor substrate includes a thin film transistor connected to a gate line and a data line formed on a substrate such that the gate line and the data line intersect each other, and a light barrier film formed on the substrate to overlap an active layer of the thin film transistor. In particular, the data line is formed on the same plane as the light barrier film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
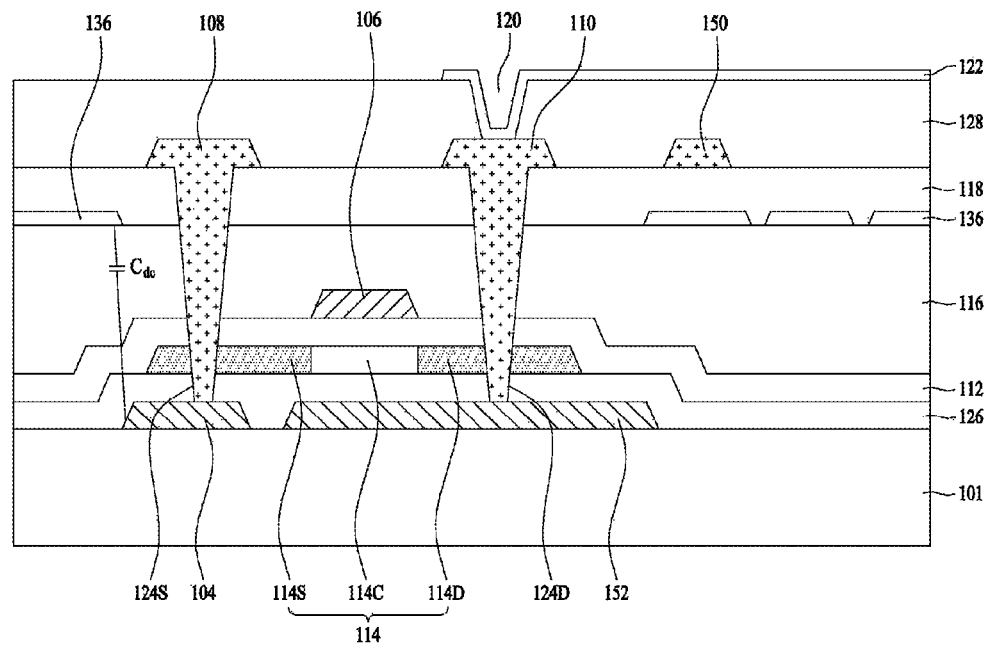
FIG. 1 is a sectional view showing a thin film transistor substrate according to a first embodiment of the present invention.

FIG. 1 is a sectional view showing a thin film transistor substrate according to the present invention. All the components of the thin film transistor (TFT) substrate and a display device having the TFT substrate in all embodiments of the present invention are operatively coupled and configured.

The thin film transistor substrate shown in FIG. 1 includes a thin film transistor, a pixel electrode 122, a common electrode 136, and a touch sensing line 150.

The thin film transistor is formed at an intersection of a gate line and a data line 104 that intersect or cross over each other in a state in which a gate insulation film 112 and a buffer layer 126 are disposed therebetween. In the thin film transistor, the pixel electrode 122 is charged with a data signal from the data line 104 in response to a scan signal from the gate line. To this end, the thin film transistor includes a gate electrode 106 connected to the gate line, a source contact electrode 108 connected to the data line 104, a drain contact electrode 110, and an active layer 114.

The scan signal from the gate line is supplied to the gate electrode 106. The gate electrode 106 overlaps a channel region 114C of the active layer in a state in which the gate insulation film 112 is disposed therebetween.

The data signal from the data line 104 is supplied to the source contact electrode 108. The source contact electrode 108 is connected to the lateral surface of the source region 114S of the active layer and the top surface of the data line 104, which are exposed through a source contact hole 124S formed through a first passivation film 118, an interlayer insulation film 116, the gate insulation film 112, and the buffer layer 126.

The drain contact electrode 110 is opposite to the source contact electrode 108 on the first passivation film 118. The drain contact electrode 110 is connected to the lateral surface of a drain region 114D of the active layer and to the top surface of a light barrier film 152, which are exposed through a drain contact hole 124D formed through the first passivation film 118, the interlayer insulation film 116, the gate insulation film 112, and the buffer layer 126.

The active layer 114 forms a channel between the source contact electrode 108 and the drain contact electrode 110. The active layer 114 includes the channel region 114C, the source region 114S, and the drain region 114D.

The channel region 114C overlaps the gate electrode 106 in a state in which the gate insulation film 112 is disposed therebetween. The source region 114S is impregnated with an n-type or p-type dopant. The source region 114S is connected to the source contact electrode 108 via the source contact hole 124S. The drain region 114D is impregnated with an n-type or p-type dopant. The drain region 114D is connected to the drain contact electrode 110 via the drain contact hole 124D. The source region 114S and the drain region 114D may be impregnated with the same dopants or different dopants having the same concentration or different concentrations. In a case in which the source region 114S and the drain region 114D are impregnated with the same dopants having the same concentration, however, it is possible to prevent the increase in number of masking processes.

The buffer layer 126, which can be made of silicon oxide or silicon nitride, is formed on a substrate 101 which can be made of glass or a plastic resin, such as polyimide (PI), in a single-layer or multi-layer structure. The buffer layer 126 prevents the diffusion of moisture or dopant caused in the substrate 101 or adjusts a speed of heat transfer during crystallization to easily achieve crystallization of the active layer 114.

The light barrier film 152 is formed on the substrate 101 so as to overlap the channel region 114C and the drain region 114D. The light barrier film 152, which is made of the same material as the data line 104, is simultaneously formed on the same plane as the data line 104. That is, the light barrier film 152, which can be made of an opaque material, such as Mo, Ti, Al, Cu, Cr, Co, W, Ta, or Ni, is formed on the substrate 101 together with the data line 104.

In addition, the top surface of the light barrier film 152 is exposed through the drain contact hole 124D such that the light barrier film 152 is connected to the drain contact electrode 110. Consequently, conductivity of the drain contact electrode 110 is improved, and therefore a transmission rate of the data signal supplied to the pixel electrode 112 is improved.

The passivation film prevents the introduction of external moisture or foreign matter to protect the respective thin films constituting the thin film transistor. The passivation film is formed to have a multi-layer structure. In the first embodiment of the present invention, a case in which first and second passivation films 118 and 128 are provided will be described by way of example.

The first passivation film 118, which is preferably made of an inorganic dielectric material, such as SiNx or SiOx, is formed between the common electrode 136 and the touch sensing line 150 so as to isolate the common electrode 136 and the touch sensing line 150 from each other. The second passivation film 128, which is preferably made of an inorganic dielectric material, such as SiNx or SiOx, is formed between the touch sensing line 150 and the pixel electrode 122 so as to isolate the touch sensing line 150 and the pixel electrode 122 from each other.

The pixel electrode 122 is formed on the second passivation film 128 of each pixel region provided by intersection between the gate line and the data line 104. The pixel electrode 122 is electrically connected to the drain contact electrode 110 exposed through the pixel contact hole 120.

The common electrode 136 is formed on the interlayer insulation film 116 such that the common electrode 136 overlaps the pixel electrode 122 in a state in which the first and second passivation films 118 and 128 are disposed therebetween to form a fringe field. In the thin film transistor substrate according to the embodiments of the present invention, therefore, the common electrode 136, to which common voltage is supplied, forms the fringe field together with the pixel electrode 122, to which a video signal is supplied through the thin film transistor, during a display period such that liquid crystal molecules horizontally arranged between the thin film transistor substrate and a color filter substrate rotate due to dielectric anisotropy. In addition, light transmissivity, preferably meaning the transmission of light through the pixel region, varies depending upon a degree of rotation of the liquid crystal molecules, thereby realizing gradation.

The touch sensing line 150, which is made of a material identical to or different from that of the first passivation film 118, is formed on the first passivation film 118, which is on the same plane as the source and the drain contact electrodes 108 and 110. The touch sensing line 150 electrically interconnects the common electrodes 136 of adjacent pixel regions such that the common electrodes 136 are used as touch sensing electrodes during a non-display period. That is, the common electrodes 136 of the respective pixel regions connected by the touch sensing line 150 are driven as the touch sensing electrodes during the non-display period to sense the change in capacitance according to a user's touch. In addition, the capacitance according to the user's touch is compared with a reference capacitance to detect the touched position.

In the thin film transistor substrate according to the embodiments of the present invention described above, the data line 104, which is made of the same material as the light barrier film 152, is formed on the same plane as the light barrier film 152. The data line 104 is isolated from the common electrode 136 in a state in which the buffer layer 126, the gate insulation film 112, and the interlayer insulation film 116 are disposed therebetween without an organic passivation film, such as photo acrylic. In this case, it is possible to reduce parasitic capacitance Cdc occurring between the data line 104 and the common electrode 136 without the organic passivation film. For this reason, it is not necessary to form the organic passivation film. In the thin film transistor substrate according to the embodiments of the present invention, therefore, no costs are incurred for the material or fabrication of the organic passivation film, whereby it is possible to reduce the cost of fabricating the thin film transistor substrate.

In addition, in the thin film transistor substrate according to the embodiments of the present invention, a process of patterning the data line 104 formed simultaneously with the light barrier film 152 and a process of patterning the organic passivation film are not needed. Consequently, the thin film transistor substrate according to the embodiments of the present invention is fabricated using eight masking processes. That is, it is possible to reduce the number of masking processes by at least two as compared with a conventional thin film transistor substrate, whereby it is possible to reduce the cost of fabricating the thin film transistor substrate in the embodiments of the present invention. Hereinafter, a method of fabricating the thin film transistor substrate of FIG. 1 according to the first embodiment of the present invention will be described with reference to FIGS. 2A to 2H.

Figure 2A:
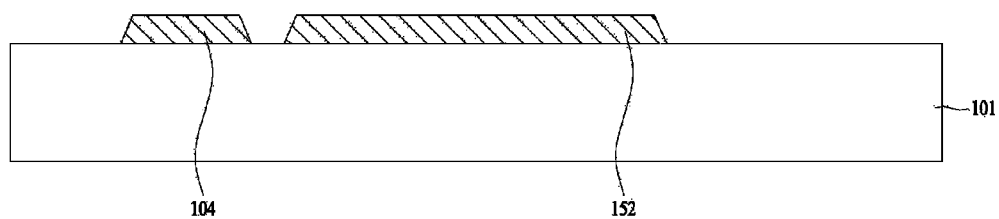
FIGS. 2A to 2H are sectional views showing a method of fabricating the thin film transistor substrate shown in FIG. 1.

Referring to FIG. 2A, a light barrier film 152 and a data line 104 are formed on a substrate 101 through a first masking process.

Specifically, an opaque metal layer is formed on a substrate 101 through a deposition process. Subsequently, the opaque metal layer is patterned through a first masking process including an etching process using a photoresist pattern formed through a photolithography process using a first mask. As a result, a light barrier film 152 and a data line 104 are formed simultaneously.

Figure 2B:
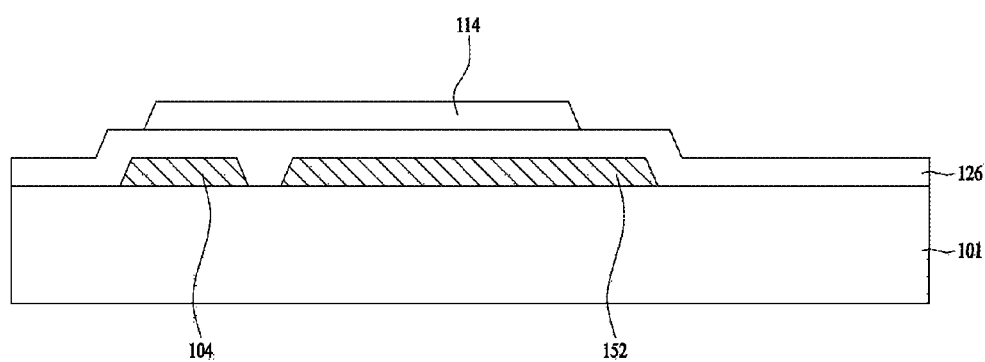

Referring to FIG. 2B, a buffer layer 126 is formed on the substrate 101, on which the light barrier film 152 and the data line 104 are formed, and an active layer 114 is formed on the buffer layer 126 through a second masking process.

Specifically, a buffer layer 126 and an amorphous silicon thin film are formed on the substrate 101 using a low pressure chemical vapor deposition (LPCVD) or plasma enhanced chemical vapor deposition (PECVD). Subsequently, the amorphous silicon thin film is crystallized into a polysilicon thin film. Subsequently, the polysilicon thin film is patterned through an etching process using a photoresist pattern formed through a photolithography process using a second mask. As a result, an active layer 114 is formed on the buffer layer 126.

Figure 2C:
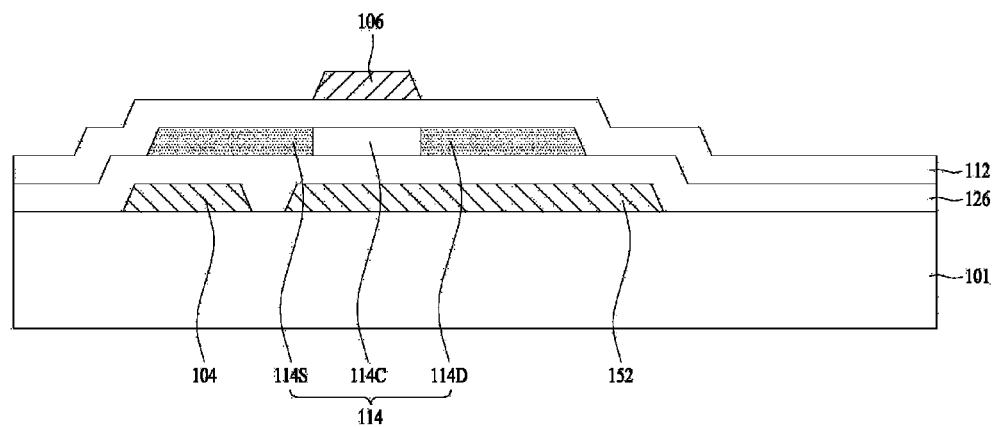

Referring to FIG. 2C, a gate insulation film 112 is formed on the buffer layer 126, on which the active layer 114 is formed, and a gate electrode 106 is formed on the gate insulation film 112 through a third masking process.

Specifically, a gate insulation film 112 is formed on the buffer layer 126, on which the active layer 114 is formed, and a gate metal layer is formed on the gate insulation film 112 using a deposition method, such as sputtering. The gate insulation film 112 is made of an inorganic dielectric material, such as SiOx or SiNx. The gate metal layer is made of a metal material, such as Mo, Ti, Cu, AlNd, Al, Cr, or an alloy thereof, and is formed to have a single-layer or multi-layer structure. Subsequently, the gate metal layer is patterned through an etching process using a photoresist pattern formed through a photolithography process using a third mask. As a result, a gate electrode 106 is formed on the gate insulation film 112.

Subsequently, the active layer 114 is impregnated with an n-type or p-type dopant using the gate electrode 106 as a mask. As a result, a source region 114S and a drain region 114D of the active layer 114, which are impregnated with the dopant, are formed, and a channel region 114C of the active layer 114, which is not impregnated with the dopant, is formed.

Figure 2D:
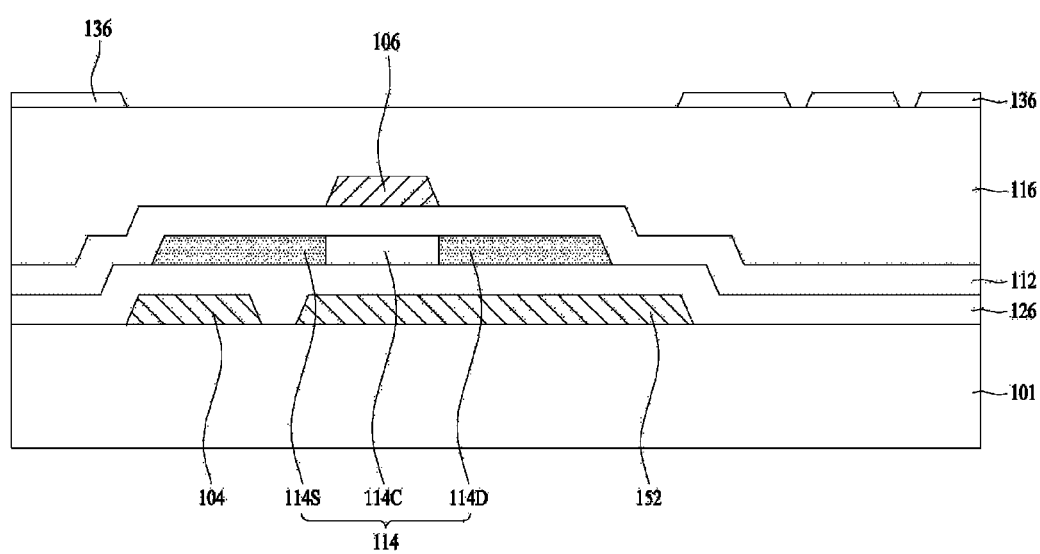

Referring to FIG. 2D, an interlayer insulation film 116 is formed on the gate insulation film 112, on which the gate electrode 106 is formed, and a common electrode 136 is formed on the interlayer insulation film 116 through a fourth masking process.

Specifically, an inorganic dielectric material, such as SiNx or SiOx, is applied over the gate insulation film 112, on which the gate electrode 106 is formed, using PECVD to form an interlayer insulation film 116 having at least one layer structure. Subsequently, a transparent metal layer, such as ITO, is formed on the interlayer insulation film 116 using a deposition method, such as sputtering. The transparent metal layer is patterned through an etching process using a photoresist pattern formed through a photolithography process using a fourth mask. As a result, a common electrode 136 is formed on the interlayer insulation film 116.

Figure 2E:
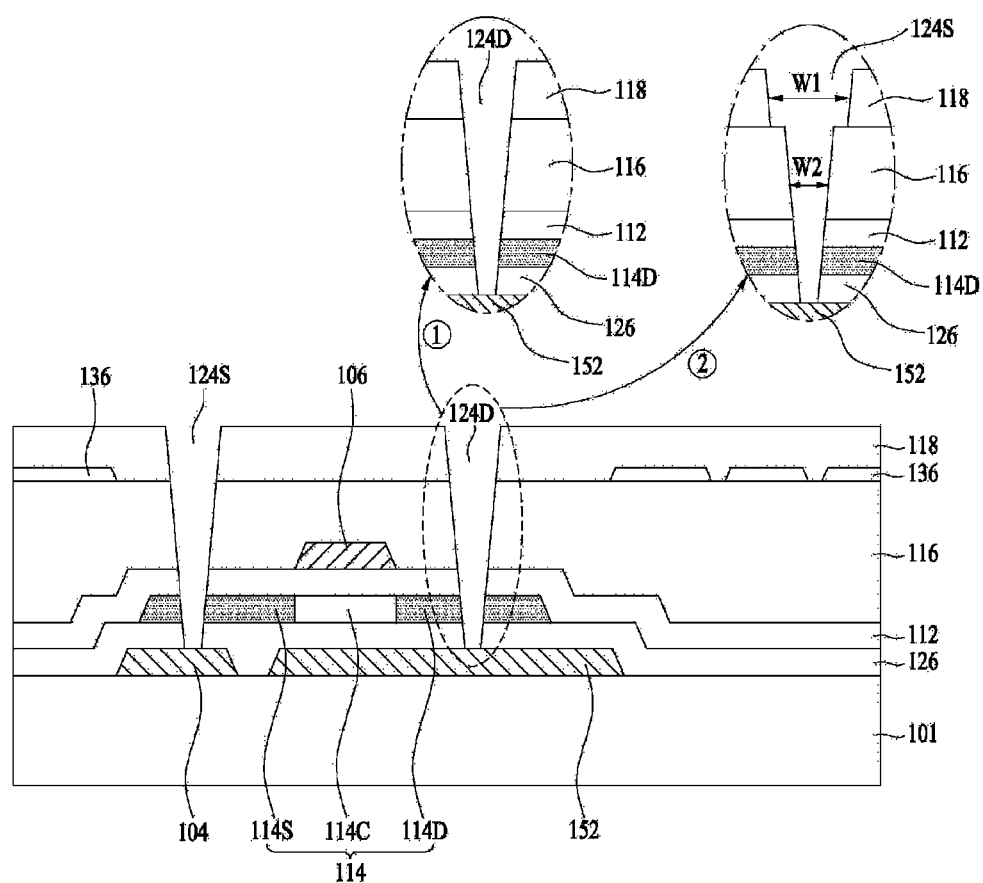

Referring to FIG. 2E, a first passivation film 118 is formed on the interlayer insulation film 116, on which the common electrode 136 is formed, and a source contact hole 124S and a drain contact hole 124D are formed through a fifth masking process.

Specifically, an inorganic dielectric material, such as SiNx or SiOx, is applied over the interlayer insulation film 116, on which the common electrode 136 is formed, using PECVD to form a first passivation film 118. Subsequently, the first passivation film 118, the interlayer insulation film 116, the gate insulation film 112, and the buffer layer 126 are patterned through an etching process using a photoresist pattern formed through a photolithography process using a fifth mask. As a result, a source contact hole 124S and a drain contact hole 124D are formed. The source contact hole 124S is formed through the first passivation film 118, the interlayer insulation film 116, the gate insulation film 112, and the buffer layer 126 to expose the lateral surface of the source region 114S and the top surface of the data line 104. The drain contact hole 124D is formed through the first passivation film 118, the interlayer insulation film 116, the gate insulation film 112, and the buffer layer 126 to expose the lateral surface of the drain region 114D and the top surface of the light barrier film 152.

Meanwhile, at the time of forming the source and drain contact holes 124S and 124D, the first passivation film 118, the interlayer insulation film 116, the gate insulation film 112, and the buffer layer 126 may be patterned simultaneously ① or separately ②.

For the simultaneous patterning ①, the source and drain contact holes 124S and 124D formed through the first passivation film 118, the interlayer insulation film 116, the gate insulation film 112, and the buffer layer 126 have gradually increasing widths.

For the separate patterning ②, the source and drain contact holes 124S and 124D formed through the first passivation film 118, the interlayer insulation film 116, the gate insulation film 112, and the buffer layer 126 have stepwise increasing widths. For example, the source and drain contact holes 124S and 124D formed through the first passivation film 118 have a first width W1, and the source and drain contact holes 124S and 124D formed through the interlayer insulation film 116, the gate insulation film 112, and the buffer layer 126, which are located under the first passivation film 118, have a second width W2, which is less than the first width W1. Consequently, the step coverage of source and drain contact electrodes 108 and 110, which will be formed on the lateral surface of the first passivation film 118, the interlayer insulation film 116, the gate insulation film 112, and the buffer layer 126 exposed through the source and drain contact holes 124S and 124D, is improved.

Figure 2F:
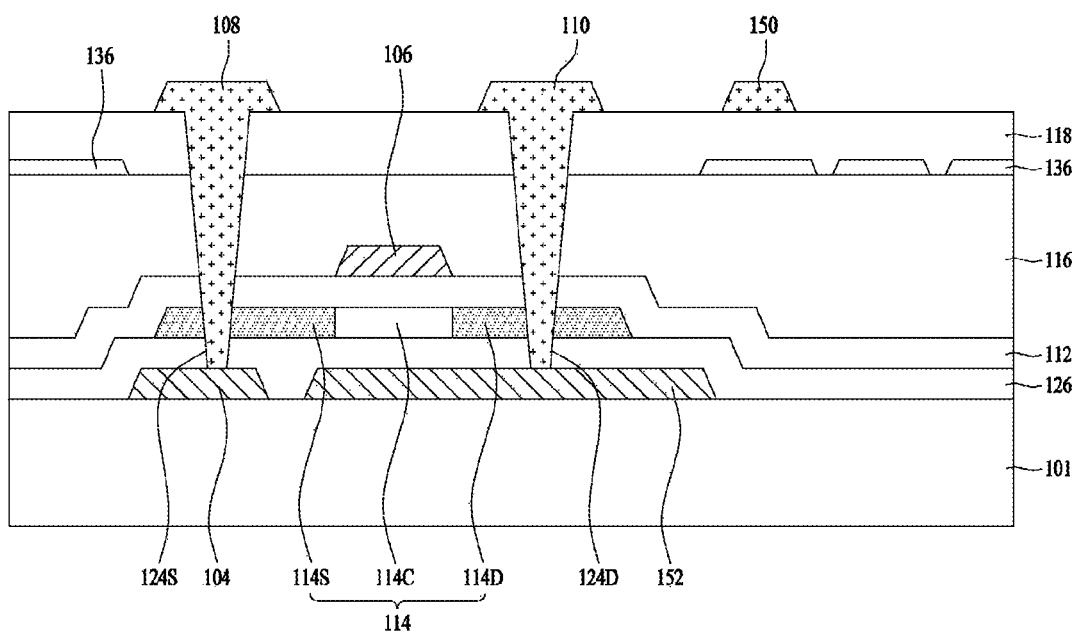

Referring to FIG. 2F, a source contact electrode 108, a drain contact electrode 110, and a touch sensing line 150 are formed on the first passivation film 118, through which the source contact hole 124S and the drain contact hole 124D are formed, through a sixth masking process.

Specifically, a source/drain metal layer is formed on the first passivation film 118, which has the source contact hole 124S and the drain contact hole 124D, using a deposition method, such as sputtering. The source/drain metal layer is made of a metal material, such as Mo, Ti, Cu, AlNd, Al, Cr, or an alloy thereof, and is formed to have a single-layer or multi-layer structure. Subsequently, the source/drain metal layer is patterned through an etching process using a photoresist pattern formed through a photolithography process using a sixth mask. As a result, a source contact electrode 108, a drain contact electrode 110, and a touch sensing line 150 are formed on the insulation film first passivation film 118.

Figure 2G:
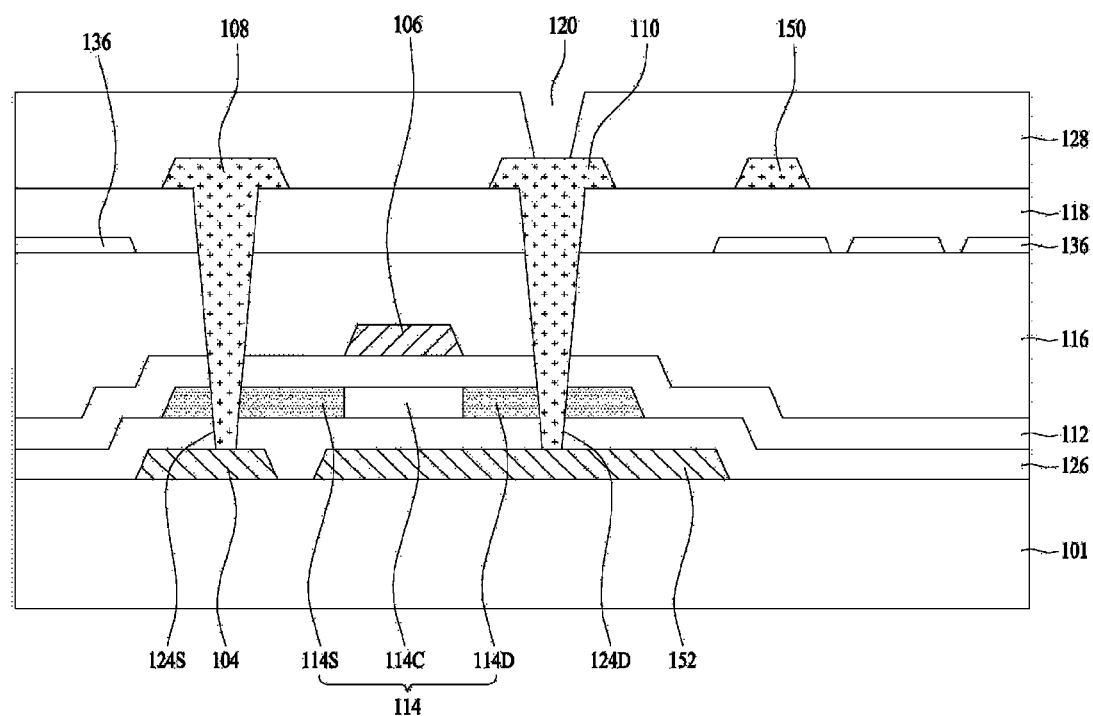

Referring to FIG. 2G, a second passivation film 128 having a pixel contact hole 120 is formed on the first passivation film 118, on which the source contact electrode 108, the drain contact electrode 110, and the touch sensing line 150 are formed, through a seventh masking process.

Specifically, an inorganic dielectric material, such as SiNx or SiOx, is applied over the first passivation film 118, on which the source contact electrode 108, the drain contact electrode 110, and the touch sensing line 150 are formed, to form a second passivation film 128. Subsequently, a pixel contact hole 120, through which the drain contact electrode 110 is exposed, is formed through an etching process using a photoresist pattern formed through a photolithography process using a seventh mask.

Figure 2H:
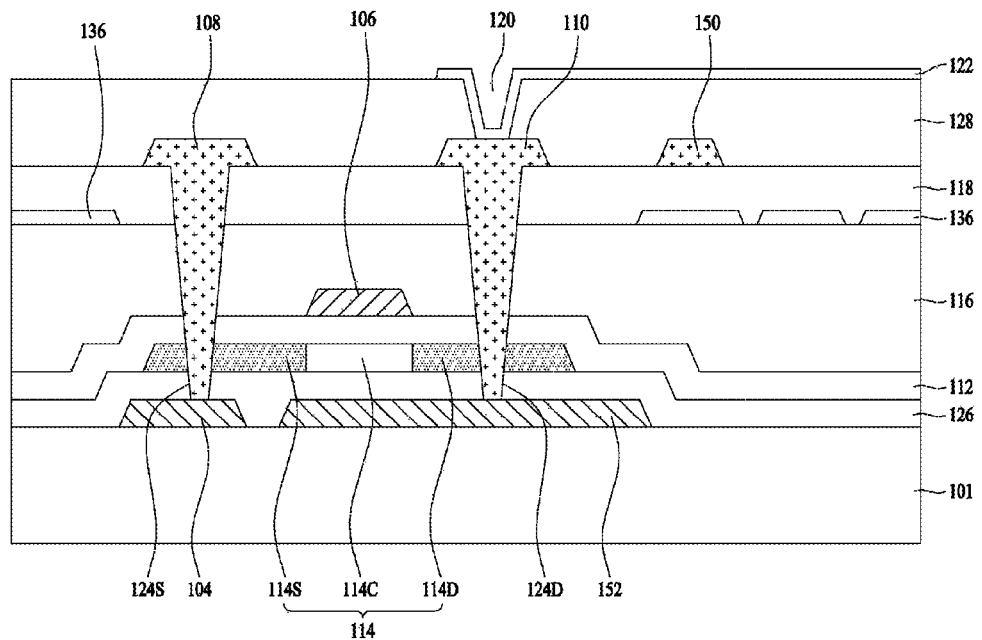

Referring to FIG. 2H, a pixel electrode 122 is formed on the second passivation film 128 having the pixel contact hole 120 through an eighth masking process.

Specifically, a transparent metal layer, such as ITO, is formed on the second passivation film 128 using a deposition method, such as sputtering. Subsequently, the transparent metal layer is patterned through an etching process using a photoresist pattern formed through a photolithography process using an eighth mask. As a result, a pixel electrode 122 is formed on the second passivation film 128. The pixel electrode 122 is electrically connected to the drain contact electrode 110, which is exposed through the pixel contact hole 120.

Figure 3:
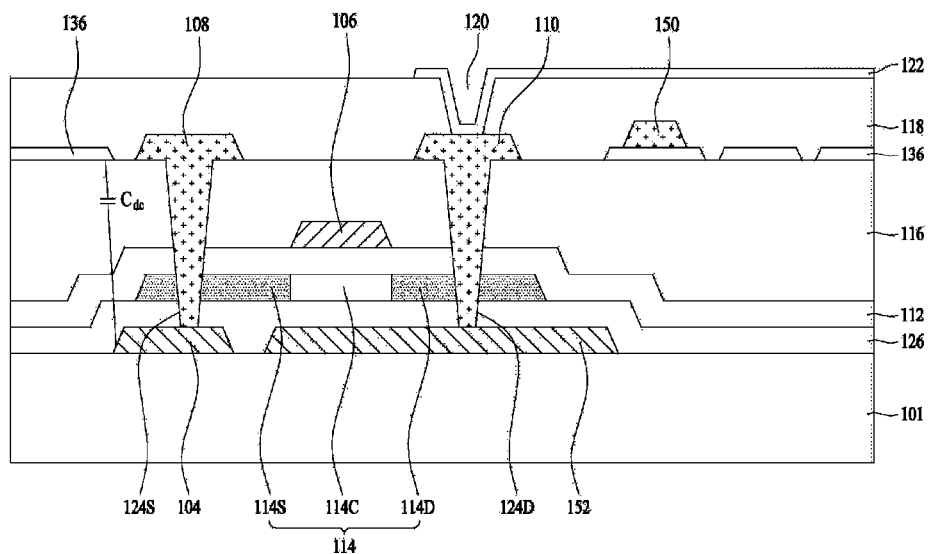
FIG. 3 is a sectional view showing a thin film transistor substrate according to a second embodiment of the present invention.

FIG. 3 is a sectional view showing a thin film transistor substrate according to a second embodiment of the present invention.

The thin film transistor substrate shown in FIG. 3 is identical in construction to the thin film transistor substrate shown in FIG. 1 except that the touch sensing line 150 is formed directly on the common electrode 136 such that the common electrode 136 and the touch sensing line 150 directly contact each other. Accordingly, a detailed description of components of the thin film transistor substrate that are the same will be omitted.

The touch sensing line 150 shown in FIG. 3, which is made of a material identical to or different from that of the source and the drain contact electrodes 108 and 110, is formed on the common electrode 136. The touch sensing line 150 electrically interconnects common electrodes 136 of adjacent pixel regions such that the common electrodes 136 are used as touch sensing electrodes during a non-display period.

The touch sensing line 150 is formed on the common electrode 136 so as to directly contact the common electrode 136. For this reason, it is not necessary to provide an additional passivation film and contact hole between the touch sensing line 150 and the common electrode 136. Consequently, the thin film transistor substrate shown in FIG. 3 includes only a single-layer passivation film 118 for isolating the common electrode 136 and the pixel electrode 122 from each other.

The passivation film 118 prevents the introduction of external moisture or foreign matter so as to protect the respective thin films constituting the thin film transistor. The passivation film 118, which is made of an inorganic dielectric material, such as SiNx or SiOx, is formed between the common electrode 136 connected to the touch sensing line 150 and the pixel electrode 122 so as to isolate the common electrode 136 and the pixel electrode 122 from each other.

The pixel electrode 122 is formed on the passivation film 118 of each pixel region provided by intersection between the gate line and the data line 104. The pixel electrode 122 is electrically connected to the drain contact electrode 110 exposed through the pixel contact hole 120.

The common electrode 136 is formed on the interlayer insulation film 116 such that the common electrode 136 overlaps the pixel electrode 122 in a state in which the passivation film 118 is disposed therebetween to form a fringe field.

In the thin film transistor substrate according to the second embodiment of the present invention described above, the data line 104, which is made of the same material as the light barrier film 152, is formed on the same plane as the light barrier film 152. The data line 104 is isolated from the common electrode 136 in a state in which the gate insulation film 112 and the interlayer insulation film 116 are disposed therebetween without an organic passivation film, such as photo acrylic. In this case, it is possible to reduce the parasitic capacitance Cdc occurring between the data line 104 and the common electrode 136 without the organic passivation film. For this reason, it is not necessary to form the organic passivation film.

In addition, in the thin film transistor substrate according to the second embodiment of the present invention, the common electrode 136 and the touch sensing line 150 directly contact each other without an additional passivation film between the common electrode 136 and the touch sensing line 150, and an additional passivation film is not formed between the data line 104 and the common electrode 136. In the thin film transistor substrate according to the second embodiment of the present invention, therefore, it is possible to reduce process time, such as light exposure time, included in the masking process at the time of forming the source and drain contact holes 124S and 124D and the pixel contact hole 120.

Furthermore, in the thin film transistor substrate according to the embodiments of the present invention, a process of patterning the data line 104 formed simultaneously with the light barrier film 152 and a process of patterning the organic passivation film are not needed. Consequently, the thin film transistor substrate according to the embodiments of the present invention is fabricated using eight masking processes. That is, it is possible to reduce the number of masking processes by at least two as compared with a conventional thin film transistor substrate, whereby it is possible to reduce the cost of fabricating the thin film transistor substrate. Hereinafter, a method of fabricating the thin film transistor substrate of FIG. 3 according to the second embodiment of the present invention will be described with reference to FIGS. 4A to 4F.

Figure 4A:
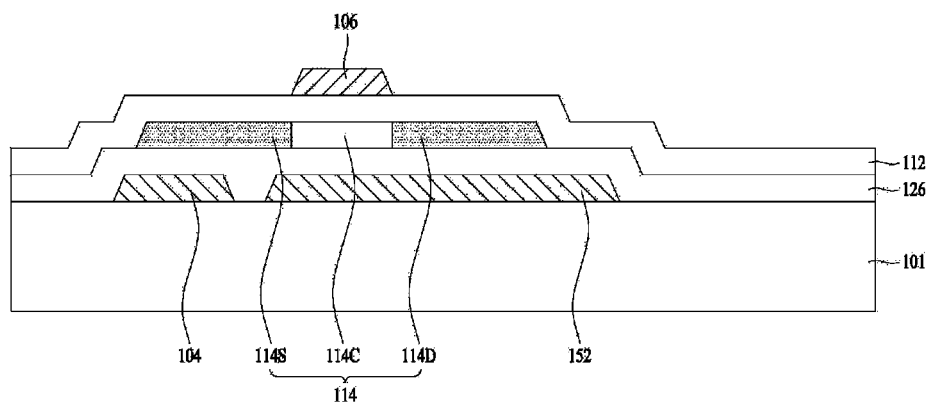
FIGS. 4A to 4F are sectional views showing a method of fabricating the thin film transistor substrate shown in FIG. 3.

Referring to FIG. 4A, a light barrier film 152 and a data line 104 are formed on a substrate 101 through a first masking process. Subsequently, a buffer layer 126 is formed on the substrate 101, on which the light barrier film 152 and the data line 104 are formed, and an active layer 114 is formed on the buffer layer 126 through a second masking process. Subsequently, a gate insulation film 112 is formed on the buffer layer 126, on which the active layer 114 is formed, and a gate electrode 106 is formed on the gate insulation film 112 through a third masking process. Meanwhile, the first to third masking processes are identical to the first to third masking processes shown in FIGS. 2A to 2C, and therefore a detailed description thereof will be omitted.

Figure 4B:
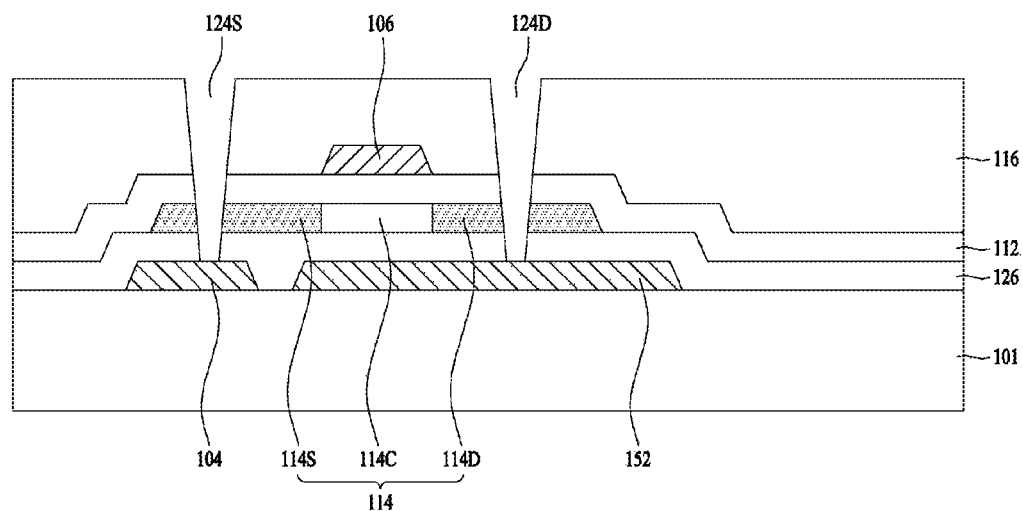

Referring to FIG. 4B, an interlayer insulation film 116 is formed on the gate insulation film 112, on which the gate electrode 106 is formed, and a source contact hole 124S and a drain contact hole 124D are formed through a fourth masking process.

Specifically, an inorganic dielectric material, such as SiNx or SiOx, is applied over the gate insulation film 112, on which the gate electrode 106 is formed, using PECVD to form an interlayer insulation film 116. Subsequently, the interlayer insulation film 116, the gate insulation film 112, and the buffer layer 126 are patterned through an etching process using a photoresist pattern formed through a photolithography process using a fourth mask. As a result, a source contact hole 124S and a drain contact hole 124D are formed. The source contact hole 124S is formed through the interlayer insulation film 116, the gate insulation film 112, and the buffer layer 126 to expose the lateral surface of the source region 114S and the top surface of the data line 104. The drain contact hole 124D is formed through the interlayer insulation film 116, the gate insulation film 112, and the buffer layer 126 to expose the lateral surface of the drain region 114D and the top surface of the light barrier film 152.

Meanwhile, at the time of forming the source and drain contact holes 124S and 124D, the interlayer insulation film 116, the gate insulation film 112, and the buffer layer 126 may be patterned simultaneously or separately.

Figure 4C:
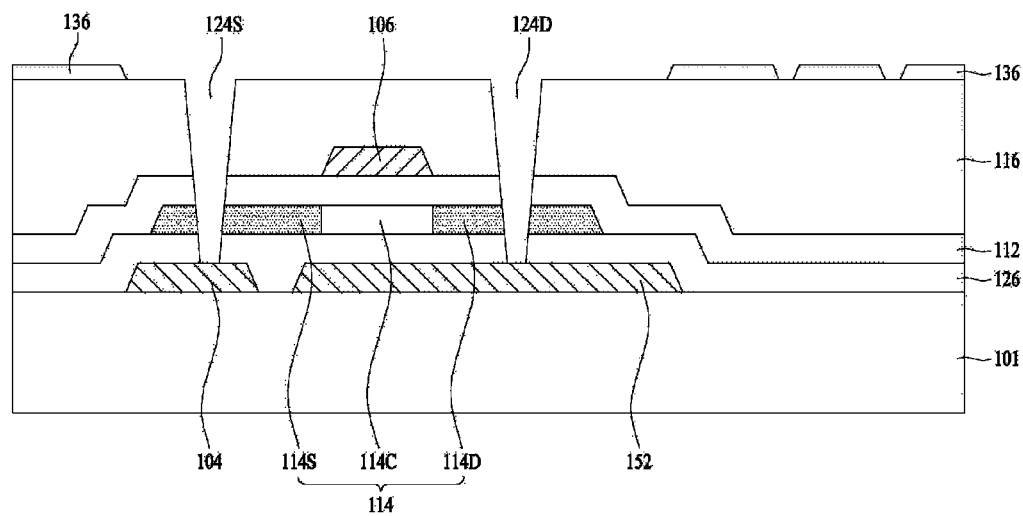

Referring to FIG. 4C, a common electrode 136 is formed on the interlayer insulation film 116, which has the source and drain contact holes 124S and 124D, through a fifth masking process.

Specifically, a transparent metal layer, such as ITO, is formed on the interlayer insulation film 116, which has the source contact hole 124S and the drain contact hole 124D, using a deposition method, such as sputtering. The transparent metal layer is patterned through an etching process using a photoresist pattern formed through a photolithography process using a fifth mask. As a result, a common electrode 136 is formed on the interlayer insulation film 116.

Figure 4D:
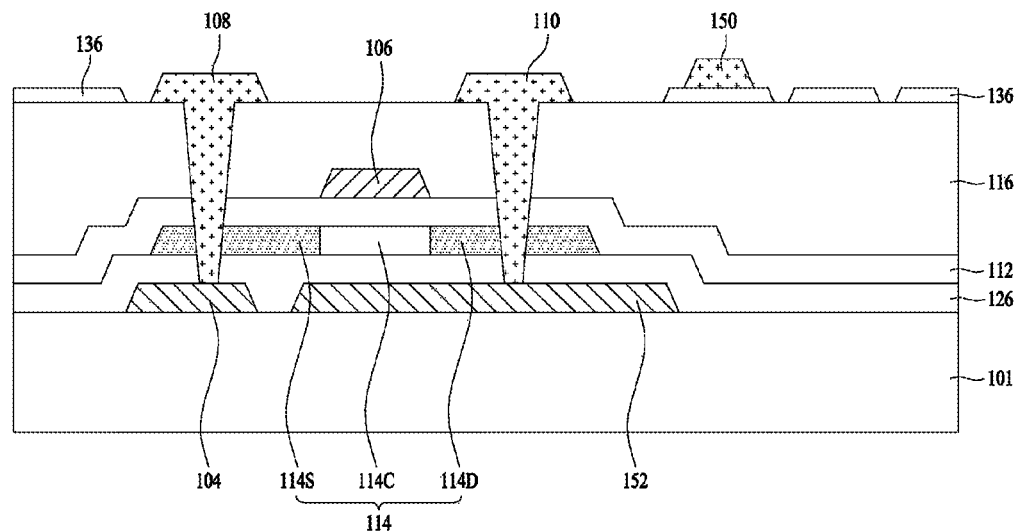

Referring to FIG. 4D, a source contact electrode 108, a drain contact electrode 110, and a touch sensing line 150 are formed on the interlayer insulation film 116, on which the common electrode 136 is formed, through a sixth masking process.

Specifically, a source/drain metal layer is formed on the interlayer insulation film 116, on which the common electrode 136 is formed, using a deposition method, such as sputtering. The source/drain metal layer is made of a metal material, such as Mo, Ti, Cu, AlNd, Al, Cr, or an alloy thereof, and is formed to have a single-layer or multi-layer structure. Subsequently, the source/drain metal layer is patterned through an etching process using a photoresist pattern formed through a photolithography process using a sixth mask. As a result, a source contact electrode 108, a drain contact electrode 110, and a touch sensing line 150 are formed on the interlayer insulation film 116.

Figure 4E:
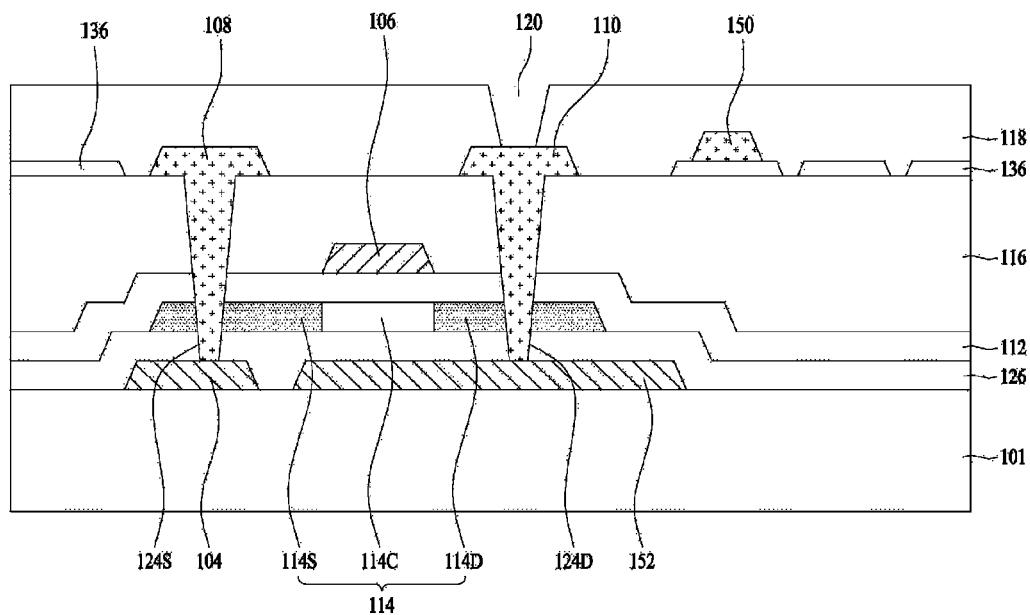

Referring to FIG. 4E, a passivation film 118 having a pixel contact hole 120 is formed on the interlayer insulation film 116, on which the source contact electrode 108, the drain contact electrode 110, and the touch sensing line 150 are formed, through a seventh masking process.

Specifically, an inorganic dielectric material, such as SiNx or SiOx, is applied over the interlayer insulation film 116, on which the source contact electrode 108, the drain contact electrode 110, and the touch sensing line 150 are formed, to form a passivation film 118. Subsequently, a pixel contact hole 120, through which the drain contact electrode 110 is exposed, is formed through an etching process using a photoresist pattern formed through a photolithography process using a seventh mask.

Figure 4F:
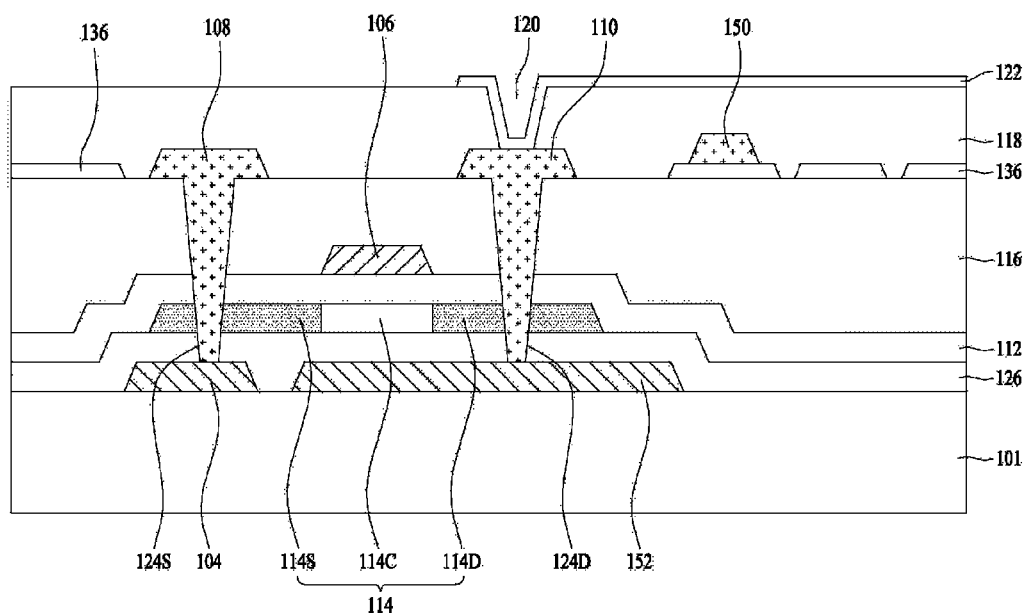

Referring to FIG. 4F, a pixel electrode 122 is formed on the passivation film 118 having the pixel contact hole 120 through an eighth masking process.

Specifically, a transparent metal layer, such as ITO, is formed on the passivation film 118 using a deposition method, such as sputtering. Subsequently, the transparent metal layer is patterned through an etching process using a photoresist pattern formed through a photolithography process using an eighth mask. As a result, a pixel electrode 122 is formed on the passivation film 118. The pixel electrode 122 is electrically connected to the drain contact electrode 110, which is exposed through the pixel contact hole 120.

Figure 5:
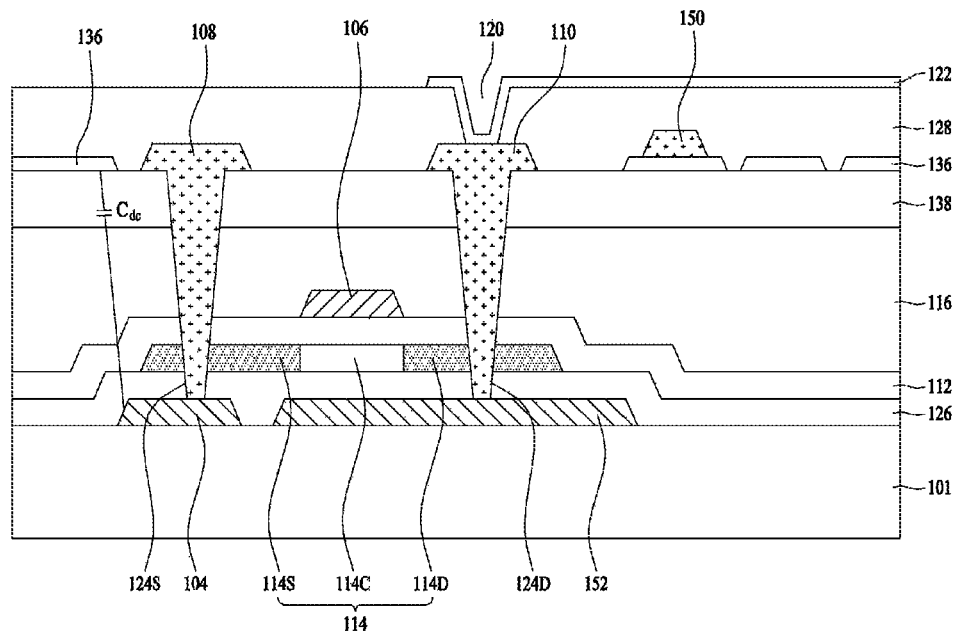
FIG. 5 is a sectional view showing a thin film transistor substrate according to a third embodiment of the present invention.

FIG. 5 is a sectional view showing a thin film transistor substrate according to a third embodiment of the present invention The thin film transistor substrate shown in FIG. 5 is identical in construction to the thin film transistor substrate shown in FIG. 3 except that a first passivation film 138 made of an organic dielectric material is further formed on the interlayer insulation film 116. Accordingly, a detailed description of components of the thin film transistor substrate that are the same will be omitted.

The first passivation film 138 formed on the interlayer insulation film 116 is made of an organic dielectric material, such as photo acrylic. The first passivation film 138 is formed between the data line 104 and the common electrode 136, which are formed on the substrate 101. As a result, the distance between the data line 104 and the common electrode 136 is greater than in the structure shown in FIG. 3. Consequently, it is possible to further reduce the parasitic capacitance Cdc.

In the thin film transistor substrate according to the third embodiment of the present invention described above, the data line 104, which is made of the same material as the light barrier film 152, is formed on the same plane as the light barrier film 152. The data line 104 is isolated from the common electrode 136 in a state in which the buffer layer 126, the gate insulation film 112, the interlayer insulation film 116, and the first passivation film 138 are disposed therebetween. In this case, it is possible to reduce the parasitic capacitance Cdc occurring between the data line 104 and the common electrode 136, even when the thickness of the first passivation film 138, which is made of an organic dielectric material, is reduced, since the buffer layer 126, the gate insulation film 112, and the interlayer insulation film 116 are disposed between the data line and the common electrode. In the thin film transistor substrate according to the embodiments of the present invention, therefore, it is possible to reduce the thickness of the first passivation film 138, which is made of an organic dielectric material. Consequently, it is possible to reduce light exposure time at the time of forming the source and drain contact holes 124S and 124D, thereby improving productivity.

In addition, in the thin film transistor substrate according to the third embodiment of the present invention, a process of patterning the data line 104 formed simultaneously with the light barrier film 152 is not needed. Consequently, the thin film transistor substrate according to the embodiments of the present invention is fabricated using eight masking processes. That is, it is possible to reduce the number of masking processes by at least two as compared with a conventional thin film transistor substrate, whereby it is possible to reduce the cost of fabricating the thin film transistor substrate. Hereinafter, a method of fabricating the thin film transistor substrate of FIG. 5 according to the third embodiment of the present invention will be described with reference to FIGS. 6A to 6F.

Figure 6A:
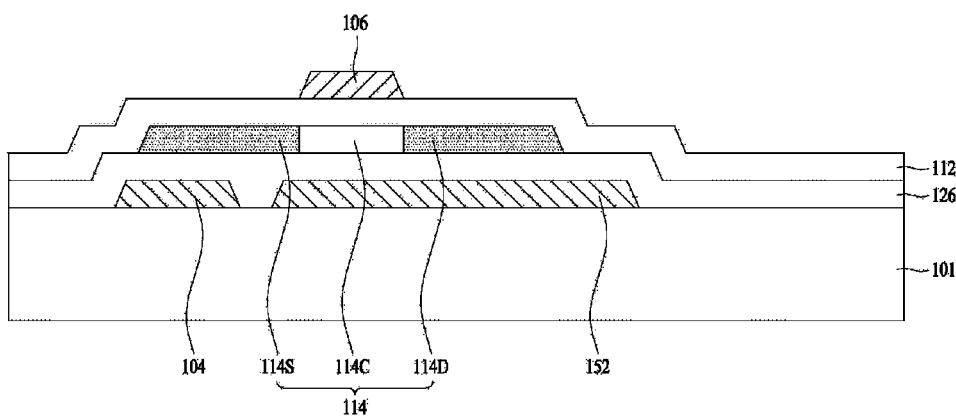
FIGS. 6A to 6F are sectional views showing a method of fabricating the thin film transistor substrate shown in FIG. 5.

Referring to FIG. 6A, a light barrier film 152 and a data line 104 are formed on a substrate 101 through a first masking process. Subsequently, a buffer layer 126 is formed on the substrate 101, on which the light barrier film 152 and the data line 104 are formed, and an active layer 114 is formed on the buffer layer 126 through a second masking process. Subsequently, a gate insulation film 112 is formed on the buffer layer 126, on which the active layer 114 is formed, and a gate electrode 106 is formed on the gate insulation film 112 through a third masking process. Meanwhile, the first to third masking processes are identical to the first to third masking processes shown in FIGS. 2A to 2C, and therefore a detailed description thereof will be omitted.

Figure 6B:
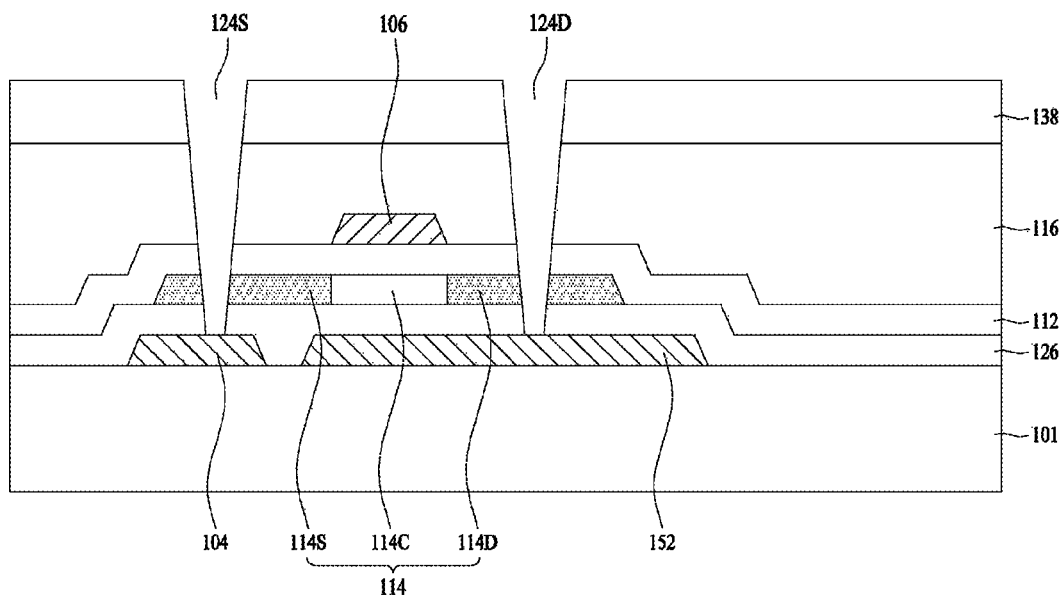

Referring to FIG. 6B, an interlayer insulation film 116 is formed on the gate insulation film 112, on which the gate electrode 106 is formed, a first passivation film 138 is formed on the interlayer insulation film 116, and a source contact hole 124S and a drain contact hole 124D are formed through the first passivation film 138 through a fourth masking process.

Specifically, an inorganic dielectric material, such as SiNx or SiOx, is applied over the gate insulation film 112, on which the gate electrode 106 is formed, using PECVD to form an interlayer insulation film 116. Subsequently, an organic passivation film, such as photo acrylic, is applied over the interlayer insulation film 116 to form a first passivation film 138. Subsequently, the first passivation film 138, the interlayer insulation film 116, the gate insulation film 112, and the buffer layer 126 are patterned through an etching process using a photoresist pattern formed through a photolithography process using a fourth mask. As a result, a source contact hole 124S and a drain contact hole 124D are formed. The source contact hole 124S is formed through the first passivation film 138, the interlayer insulation film 116, the gate insulation film 112, and the buffer layer 126 to expose the lateral surface of the source region 114S and the top surface of the data line 104. The drain contact hole 124D is formed through the first passivation film 138, the interlayer insulation film 116, the gate insulation film 112, and the buffer layer 126 to expose the lateral surface of the drain region 114D and the top surface of the light barrier film 152.

Meanwhile, at the time of forming the source and drain contact holes 124S and 124D, the first passivation film 138, the interlayer insulation film 116, the gate insulation film 112, and the buffer layer 126 may be patterned simultaneously using one mask or separately using two masks. For separate patterning, thin films made of different materials may be patterned separately. For example, the first passivation film 138 may be made of an organic dielectric material that is different from that of the interlayer insulation film 116, the gate insulation film 112, and the buffer layer 126. Consequently, the first passivation film 138, which is made of an organic dielectric material, may be patterned, and then the interlayer insulation film 116, the gate insulation film 112, and the buffer layer 126, each of which is made of an inorganic dielectric material, may be patterned using a mask that is different from that used to pattern the first passivation film 138.

Figure 6C:
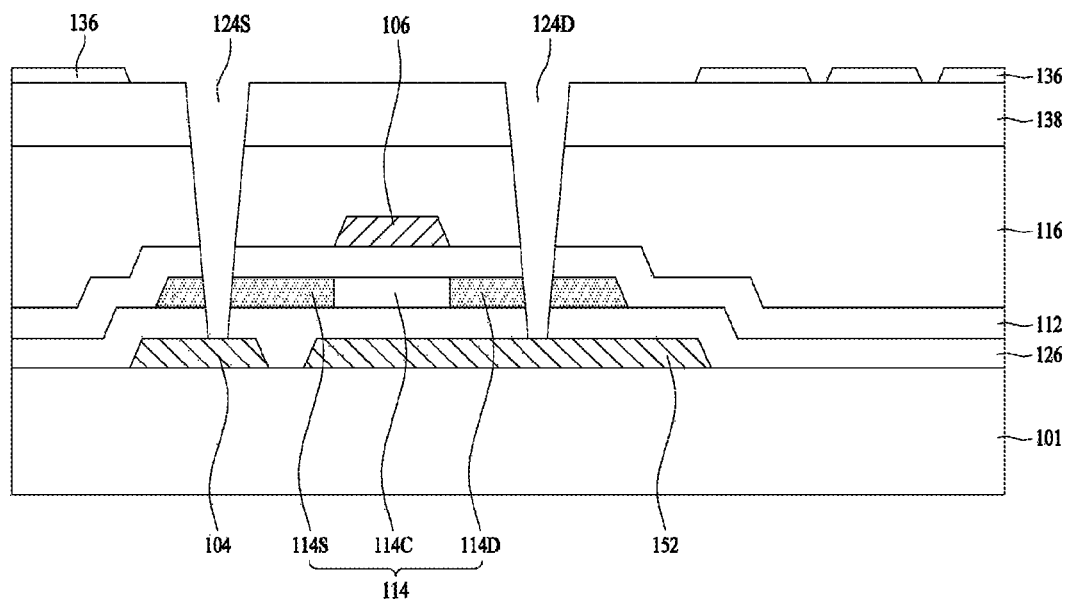

Referring to FIG. 6C, a common electrode 136 is formed on the first passivation film 138, which has the source and drain contact holes 124S and 124D, through a fifth masking process.

Specifically, a transparent metal layer, such as ITO, is formed on the first passivation film 138, which has the source contact hole 124S and the drain contact hole 124D, using a deposition method, such as sputtering. The transparent metal layer is patterned through an etching process using a photoresist pattern formed through a photolithography process using a fifth mask. As a result, a common electrode 136 is formed on the first passivation film 138.

Figure 6D:
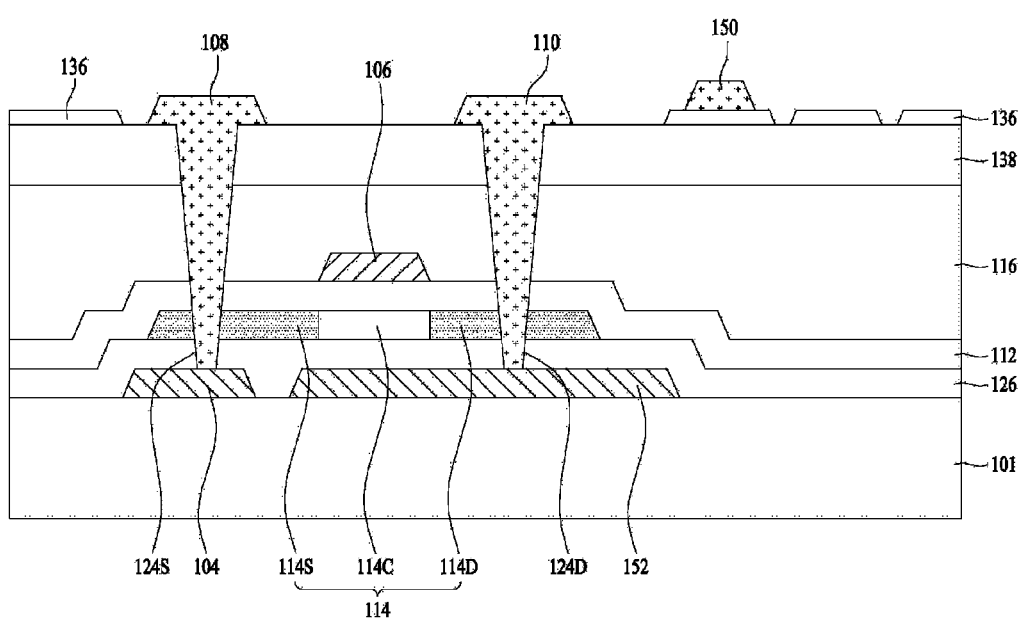

Referring to FIG. 6D, a source contact electrode 108, a drain contact electrode 110, and a touch sensing line 150 are formed on the first passivation film 138, on which the common electrode 136 is formed, through a sixth masking process.

Specifically, a source/drain metal layer is formed on the first passivation film 138, on which the common electrode 136 is formed, using a deposition method, such as sputtering. The source/drain metal layer is made of a metal material, such as Mo, Ti, Cu, AlNd, Al, Cr, or an alloy thereof, and is formed to have a single-layer or multi-layer structure. Subsequently, the source/drain metal layer is patterned through an etching process using a photoresist pattern formed through a photolithography process using a sixth mask. As a result, a source contact electrode 108, a drain contact electrode 110, and a touch sensing line 150 are formed on the first passivation film 138.

Figure 6E:
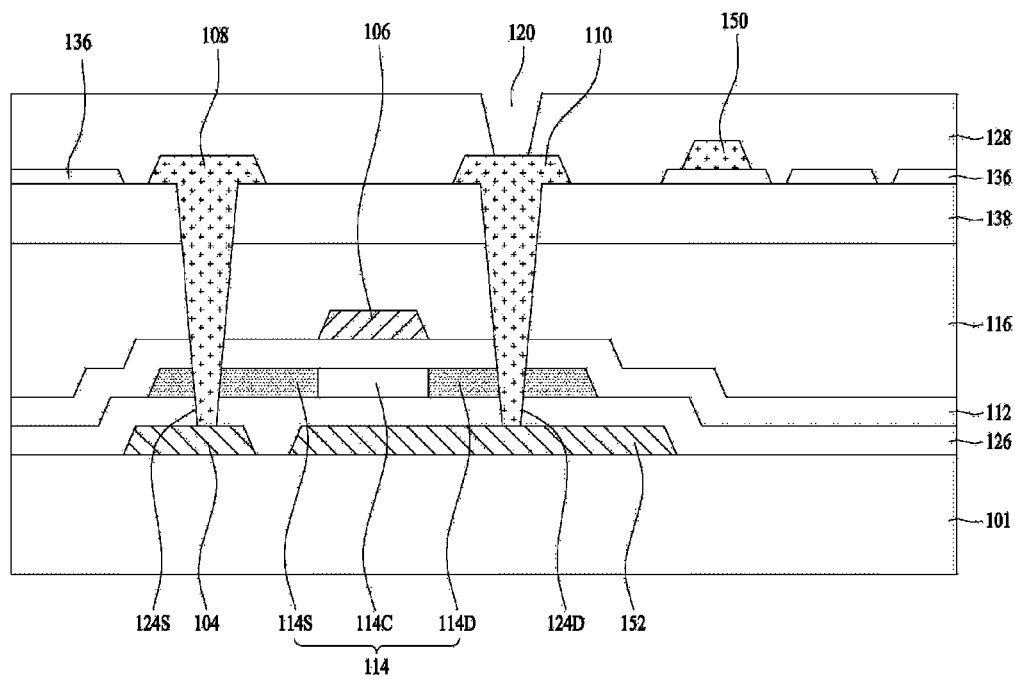

Referring to FIG. 6E, a second passivation film 128 having a pixel contact hole 120 is formed on the first passivation film 138, on which the source contact electrode 108, the drain contact electrode 110, and the touch sensing line 150 are formed, through a seventh masking process.

Specifically, an inorganic dielectric material, such as SiNx or SiOx, is applied over the first passivation film 138, on which the source contact electrode 108, the drain contact electrode 110, and the touch sensing line 150 are formed, to form a second passivation film 128. Subsequently, a pixel contact hole 120, through which the drain contact electrode 110 is exposed, is formed through an etching process using a photoresist pattern formed through a photolithography process using a seventh mask.

Figure 6F:
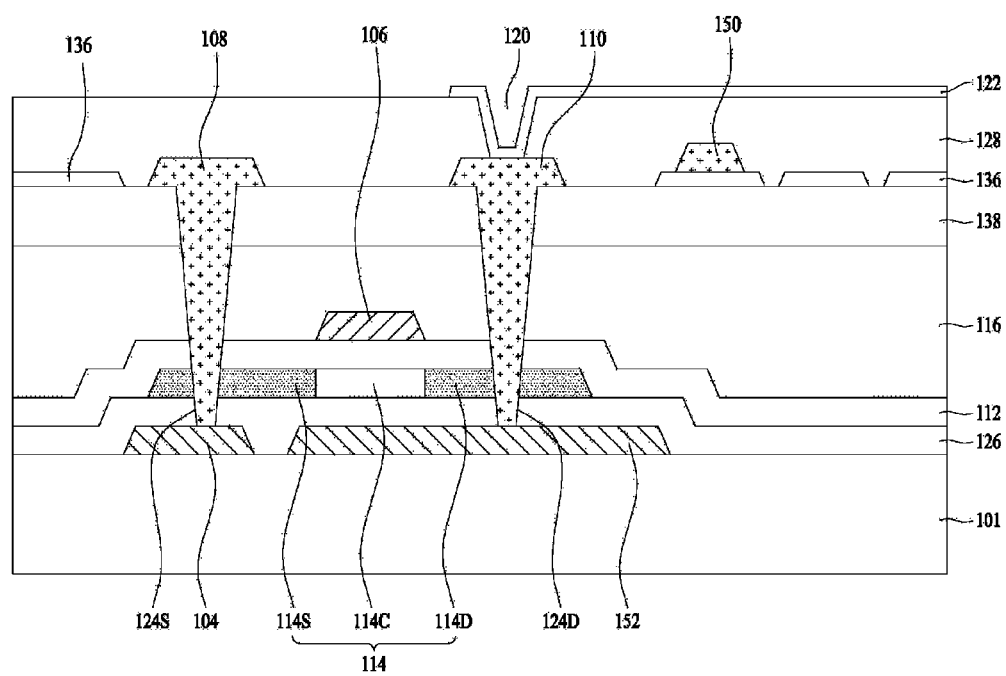

Referring to FIG. 6F, a pixel electrode 122 is formed on the second passivation film 128 having the pixel contact hole 120 through an eighth masking process.

Specifically, a transparent metal layer, such as ITO, is formed on the second passivation film 128 using a deposition method, such as sputtering. Subsequently, the transparent metal layer is patterned through an etching process using a photoresist pattern formed through a photolithography process using an eighth mask. As a result, a pixel electrode 122 is formed on the second passivation film 128. The pixel electrode 122 is electrically connected to the drain contact electrode 110, which is exposed through the pixel contact hole 120.

Figure 7:
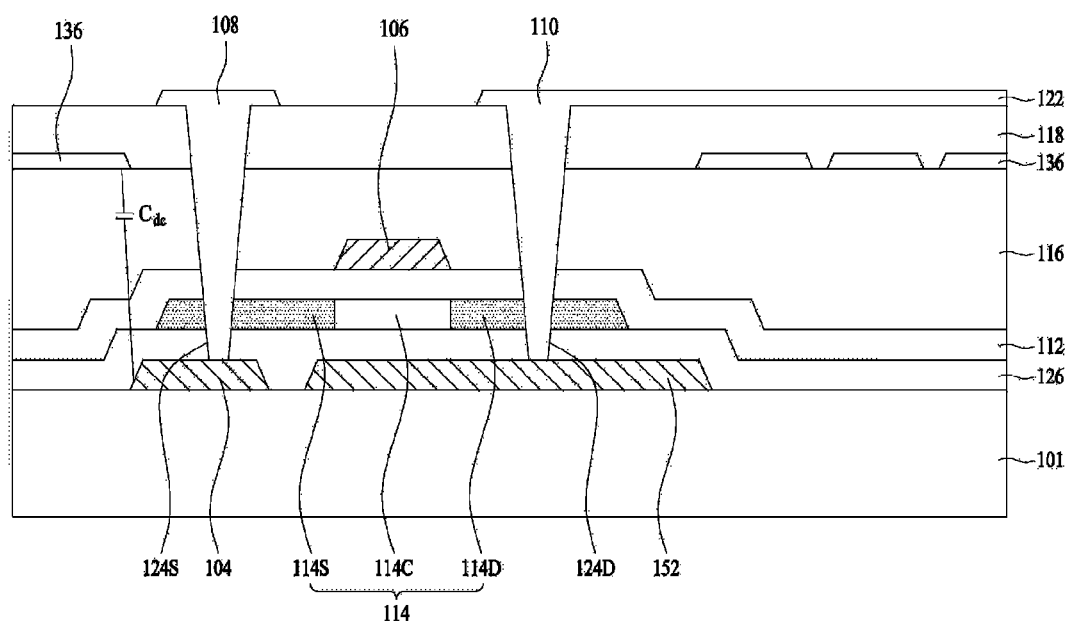
FIG. 7 is a sectional view showing a thin film transistor substrate according to a fourth embodiment of the present invention.

Meanwhile, the thin film transistor substrate according to one or more embodiments of the present invention is configured to have an in cell touch structure including the touch sensing line 150 as described above. Alternatively, as shown in FIG. 7, the present invention may be applied to a thin film transistor substrate for liquid crystal displays that does not include a touch sensing line. In this case, the data line 104 and the light barrier film 152, which are made of the same material, are simultaneously formed on the same plane, i.e., on the substrate 101, through a first masking process, the active layer 114 is formed on the buffer layer 126 through a second masking process, the gate electrode 106 is formed on the gate insulation film 112 through a third masking process, the common electrode 136 is formed on the interlayer insulation film 116 through a fourth masking process, the source and drain contact holes 124S and 124D are formed through a fifth masking process, and the source contact electrode 108, the drain contact electrode 110, and the pixel electrode 122, which are made of the same material (e.g., ITO), are simultaneously formed on the same plane (i.e., the passivation film 118) through a sixth masking process.

Meanwhile, the thin film transistor substrate according to one or more embodiments of the present invention is applied to a fringe electric field type liquid crystal display panel as described above. Alternatively, the present invention may be applied to all liquid crystal display panels, such as a horizontal electric field type liquid crystal display panel, in which the common electrode and the pixel electrode are disposed on the same substrate.

In addition, in the embodiments of the present invention, the pixel electrode 110 is connected to the drain contact electrode 110 as described above. Alternatively, the pixel electrode 110 may be connected to the source contact electrode 108. In this case, the light barrier film 152 is connected to the source contact electrode 108, and the data line 104 is connected to the drain contact electrode 110.

In addition, in the embodiments of the present invention, the data line 104 and the light barrier film 152, which are made of the same material, are simultaneously formed using a single masking process as described above. Alternatively, the data line 104 and the light barrier film 152, which are made of different materials, may be formed through a single masking process using a halftone mask or a diffraction mask, or through two masking processes.

Furthermore, in the embodiments of the present invention, the common electrode 136 is formed, and then the touch sensing line 150 is formed, as described above. Alternatively, the touch sensing line 150 may first be formed, and then the common electrode 136 may be formed. That is, the touch sensing line 150 may be located above the common electrode 136 as shown in FIGS. 1, 3, and 5, or under the common electrode 136.

As is apparent from the above description, in a thin film transistor substrate according to the embodiments of the present invention and a method of fabricating the same, a data line is formed on the same plane as a light barrier film. In this case, it is possible to reduce parasitic capacitance occurring between the data line and a common electrode even when a passivation film made of an organic dielectric material is not provided or even when the thickness of the passivation film, which is made of the organic dielectric material, is reduced. Consequently, it is possible to reduce the cost of fabricating the thin film transistor substrate.

In addition, in the thin film transistor substrate according to the embodiments of the present invention and the method of fabricating the same, a process of patterning the data line simultaneously with the light barrier film and a process of patterning the passivation film, which is made of the organic dielectric material, are not needed. Consequently, it is possible to reduce the number of masking processes by at least two, whereby it is possible to reduce the cost of fabricating the thin film transistor substrate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A thin film transistor substrate comprising:
    a thin film transistor connected to a gate line and a data line on a substrate such that the gate line and the data line intersect each other; and
    a light barrier film on the substrate to overlap an active layer of the thin film transistor, wherein the data line is disposed on a same plane as the light barrier film.

2. The thin film transistor substrate according to claim 1, further comprising:
    a pixel electrode connected to the thin film transistor;
    a common electrode for generating an electric field together with the pixel electrode; and
    a multi-layer insulation film between the common electrode and the data line, wherein the multi-layer insulation film comprises:
        a buffer layer on the substrate to cover the light barrier film and the data line;
        a gate insulation film on the buffer layer to cover the active layer; and
        an interlayer insulation film on the gate insulation film to cover a gate electrode of the thin film transistor.

3. The thin film transistor substrate according to claim 2, further comprising:
    a first passivation film on the interlayer insulation film to cover the common electrode;
    a touch sensing line on the first passivation film for interconnecting common electrodes of adjacent sub-pixels such that the common electrode is driven as a touch sensing electrode; and
    a second passivation film to cover the touch sensing line,
    wherein a drain contact electrode of the thin film transistor is connected to the light barrier film disposed on the substrate and a drain region of the active layer through a drain contact hole penetrated through the first passivation film, the interlayer insulation film, the gate insulation film, and the buffer layer, and
    wherein a source contact electrode of the thin film transistor is connected to the data line disposed on the substrate and a source region of the active layer through a source contact hole penetrated through the first passivation film, the interlayer insulation film, the gate insulation film, and the buffer layer.

4. The thin film transistor substrate according to claim 3, wherein the source and drain contact holes penetrated through the first passivation film have a first width,
    wherein the source and drain contact holes penetrated through the interlayer insulation film, the gate insulation film, and the buffer layer have a second width, and
    wherein the second width is less than the first width.

5. The thin film transistor substrate according to claim 2, further comprising:
    a touch sensing line on the common electrode to directly contact the common electrode, the touch sensing line interconnecting common electrodes of adjacent sub-pixels such that the common electrode is driven as a touch sensing electrode; and
    a passivation film on the interlayer insulation film to cover the common electrode and the touch sensing line, wherein a drain contact electrode of the thin film transistor is connected to the light barrier film disposed on the substrate and a drain region of the active layer through a drain contact hole penetrated through the interlayer insulation film, the gate insulation film, and the buffer layer, and wherein a source contact electrode of the thin film transistor is connected to the data line disposed on the substrate and a source region of the active layer through a source contact hole penetrated through the interlayer insulation film, the gate insulation film, and the buffer layer.

6. The thin film transistor substrate according to claim 2, wherein the thin film transistor comprises:
the active layer having a channel region, a source region, and a drain region;
a gate electrode overlapping the channel region of the active layer on the gate insulation film;
a source contact electrode connected to the source region and the data line under the source region; and
a drain contact electrode connected to the drain region and the light barrier film under drain region.

7. The thin film transistor substrate according to claim 6, further comprising:
a first passivation film on the interlayer insulation film,
wherein the drain contact electrode is connected to the light barrier film disposed on the substrate and the drain region of the active layer through a drain contact hole is penetrated through the first passivation film, the interlayer insulation film, the gate insulation film, and the buffer layer, and
wherein the source contact electrode is connected to the data line disposed on the substrate and the source region of the active layer through a source contact hole is penetrated through the first passivation film, the interlayer insulation film, the gate insulation film, and the buffer layer.

8. The thin film transistor substrate according to claim 6, wherein the drain contact electrode is connected to the light barrier film disposed on the substrate and the drain region of the active layer through a drain contact hole is penetrated through the interlayer insulation film, the gate insulation film, and the buffer layer, and
wherein the source contact electrode is connected to the data line disposed on the substrate and the source region of the active layer through a source contact hole is penetrated through the interlayer insulation film, the gate insulation film, and the buffer layer.

9. A thin film transistor substrate comprising:
a thin film transistor connected to a gate line and a data line on a substrate such that the gate line and the data line intersect each other;
a light barrier film on the substrate to overlap an active layer of the thin film transistor;
a pixel electrode connected to the thin film transistor;
a common electrode for generating an electric field together with the pixel electrode; and
a multi-layer insulation film between the common electrode and the data line, the multi-layer insulation film comprising at least a one-layer passivation film made of an organic material, wherein the data line is disposed on a same plane as the light barrier film.

10. The thin film transistor substrate according to claim 9, wherein the multi-layer insulation film comprises:
a buffer layer on the substrate to cover the light barrier film and the data line;
a gate insulation film on the buffer layer to cover the active layer;
an interlayer insulation film on the gate insulation film to cover a gate electrode of the thin film transistor; and
the passivation film, made of the organic material, disposed on the interlayer insulation film.

11. The thin film transistor substrate according to claim 10, further comprising:
a touch sensing line for interconnecting common electrodes of adjacent sub-pixels such that the common electrode is driven as a touch sensing electrode,
wherein the touch sensing line is on the common electrode or under the common electrode to directly contact the common electrode.

12. The thin film transistor substrate according to claim 10, wherein the thin film transistor comprises:
the active layer having a channel region, a source region, and a drain region;
a gate electrode overlapping the channel region of the active layer on the gate insulation film;
a source contact electrode connected to the source region and the data line under the source region; and
a drain contact electrode connected to the drain region and the light barrier film under drain region.

13. The thin film transistor substrate according to claim 12, wherein the drain contact electrode is connected to the light barrier film disposed on the substrate and the drain region of the active layer through a drain contact hole is penetrated through the passivation film, the interlayer insulation film, the gate insulation film, and the buffer layer, and
wherein the source contact electrode is connected to the data line disposed on the substrate and the source region of the active layer through a source contact hole is penetrated through the passivation film, the interlayer insulation film, the gate insulation film, and the buffer layer.

* * * * *